(12) United States Patent
Zheng et al.

(10) Patent No.: US 7,148,118 B2
(45) Date of Patent: Dec. 12, 2006

(54) METHODS OF FORMING METAL NITRIDE, AND METHODS OF FORMING CAPACITOR CONSTRUCTIONS

(75) Inventors: Lingyi A. Zheng, Boise, ID (US); Er-Xuan Ping, Manassas, VA (US)

(73) Assignee: Micron Technology, Inc., Boise, ID (US)

( * ) Notice: Subject to any disclaimer, the term of this patent is extended or adjusted under 35 U.S.C. 154(b) by 375 days.

(21) Appl. No.: 10/887,962

(22) Filed: Jul. 8, 2004

(65) Prior Publication Data

US 2006/0009019 A1    Jan. 12, 2006

(51) Int. Cl.
*H01L 21/20* (2006.01)
(52) U.S. Cl. ............... 438/393; 438/627; 257/E21.006
(58) Field of Classification Search ............... 438/393, 438/627
See application file for complete search history.

(56) References Cited

U.S. PATENT DOCUMENTS

| | | | |
|---|---|---|---|
| 6,287,965 B1 * | 9/2001 | Kang et al. | 438/648 |
| 6,348,376 B1 * | 2/2002 | Lim et al. | 438/253 |
| 6,590,251 B1 * | 7/2003 | Kang et al. | 257/310 |
| 2001/0043453 A1 * | 11/2001 | Narwankar et al. | 361/306.3 |

* cited by examiner

Primary Examiner—Asok Kumar Sarkar
(74) Attorney, Agent, or Firm—Wells St. John P.S.

(57) ABSTRACT

The invention encompasses methods of forming metal nitride proximate dielectric materials. The metal nitride comprises two portions, with one of the portions being nearer the dielectric material than the other. The portion of the metal nitride nearest the dielectric material is formed from a non-halogenated metal-containing precursor, and the portion of the metal nitride further from the dielectric material is formed from a halogenated metal-containing precursor. The methodology of the present invention can be utilized for forming capacitor constructions, with the portion of the metal nitride formed from the halogenated metal-containing precursor being incorporated into a capacitor electrode.

87 Claims, 3 Drawing Sheets

_Fig 5_

_Fig 6_

METHODS OF FORMING METAL NITRIDE, AND METHODS OF FORMING CAPACITOR CONSTRUCTIONS

TECHNICAL FIELD

The invention pertains to methods of forming metal nitride, and in particular aspects pertains to methods of forming capacitor constructions.

BACKGROUND OF THE INVENTION

There are numerous applications for metal nitride in modern semiconductor fabrication. For instance, metal nitride is frequently incorporated into capacitor electrodes. Problems can occur in utilizing various metal nitrides, and accordingly it is desired to develop new methods for incorporating metal nitride into semiconductor structures, and in particular it is desired to develop new methods for incorporating metal nitride into capacitor structures.

SUMMARY OF THE INVENTION

In one aspect, the invention includes a method of forming a metal nitride proximate a dielectric material. A portion of the metal nitride nearest the dielectric material is formed from a non-halogenated metal-containing precursor without using halogenated metal-containing precursor. A portion of the metal nitride furthest from the dielectric material is formed from a halogenated metal-containing precursor.

In one aspect, the invention encompasses a method of forming a capacitor construction. A semiconductor substrate is provided, and a first capacitor electrode is formed over the semiconductor substrate. A dielectric material is formed over the first capacitor electrode. A first metal nitride layer is formed over the dielectric material utilizing a non-halogenated metal-containing precursor. A second metal nitride layer is formed over the first metal nitride layer utilizing a halogenated metal-containing precursor.

In one aspect, the invention encompasses a method of forming a capacitor construction in which a first capacitor electrode comprises a metal nitride layer formed from a halogenated metal-containing precursor. A second metal nitride layer is formed from a non-halogenated metal-containing precursor, and is formed over the first metal nitride layer. A dielectric material is formed over the second metal nitride layer, and a second capacitor electrode is formed over the dielectric material.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

One aspect of the invention is a recognition that it can be advantageous to form metal nitride to comprise two different layers, with each of the layers formed from a different precursor than the other. It can be particularly advantageous to utilize metal nitride comprising the two different layers when forming the metal nitride proximate a high-k dielectric material (with the term high-k dielectric material referring to a dielectric material having a dielectric constant greater than that of silicon dioxide). Exemplary high-k dielectric materials are aluminum oxide and hafnium oxide. Two types of precursor that can be utilized for forming metal nitride are halogenated precursor and non-halogenated metallo-organic precursor. For instance, titanium nitride can be formed from the exemplary halogenated precursor titanium tetrachloride ($TiCl_4$), or alternatively can be formed from the exemplary non-halogenated metallo-organic precursor tetrakis-dimethyl-amido-titanium (TDMAT). Titanium nitride is but one exemplary metal nitride, and other metal nitrides can similarly be formed from halogenated and non-halogenated precursors.

Metal nitride formed from halogenated precursor (such as, for example, titanium nitride formed from titanium tetrachloride) is relatively resistant to oxidation compared to metal nitride formed from metallo-organic precursors (such as, for example, titanium nitride formed from TDMAT), and also can be formed relatively rapidly by commonly-used deposition methods, such as, for example, chemical vapor deposition (CVD) and atomic layer deposition (ALD). However, metal nitride formed from halogenated precursor will frequently have some halogen incorporated therein (for instance, titanium nitride formed from titanium tetrachloride frequently has some chlorine dispersed therein). If the metal nitride formed from a halogenated precursor is formed proximate a dielectric material without an intervening barrier, halogen can permeate from the metal nitride into the dielectric material. Such permeation can occur during, for example, deposition and/or post-deposition steps. The halogen can adversely-affect the properties of the dielectric material, with the adverse effects being particularly problematic relative to high-k dielectric materials.

One aspect of the present invention is to form metal nitride to contain two portions, with each of the portions being primarily from a different precursor than the other. A portion of the metal nitride closest to a dielectric material is formed utilizing an metallo-organic precursor, and a portion of the metal nitride further from the dielectric material is formed utilizing halogenated precursor. The portion of the metal nitride formed from halogenated precursor can protect the portion formed from metallo-organic precursor from oxidation, and the portion formed from metallo-organic precursor can function as a barrier layer to impede, and in particular applications entirely prevent, migration of halogen from the other portion of the metal nitride into the dielectric material.

The invention described herein can be particularly useful for forming capacitor constructions, in that capacitor constructions frequently have metal nitride formed proximate dielectric materials. However, it is to be understood that the invention is not limited to such applications. Also, although the invention can be particularly useful for utilization in conjunction with high-k dielectric materials, in that the high-k dielectric materials are typically more severely affected by halogen migration than are lower-k dielectric materials, it is to be understood that the invention can also have advantageous aspects for utilization with low-k dielectric materials (with the term low-k dielectric material referring to dielectric materials having a dielectric constant equal to or less than that of silicon dioxide). Additionally, although the invention is described with reference to metal nitride materials comprising two portions, it is to be understood that the invention also includes aspects in which metal nitride comprises more than two portions.

Figure 1:
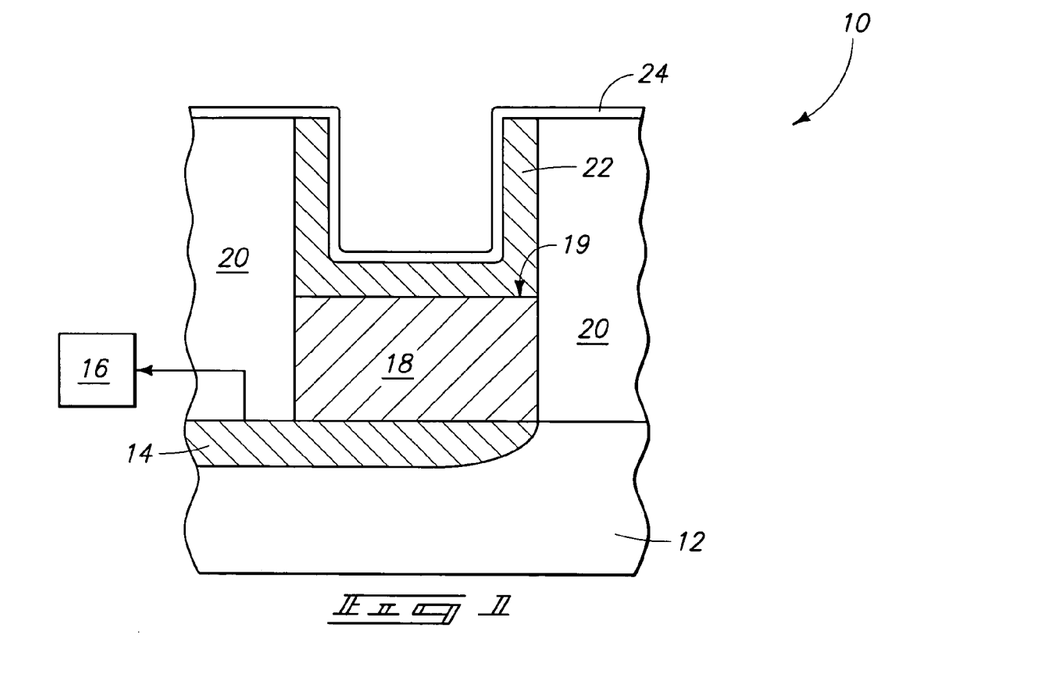
FIG. 1 is a diagrammatic, cross-sectional view of a semiconductor wafer fragment at a preliminary processing stage of an exemplary first embodiment aspect of the present invention.

An exemplary first embodiment of the present invention is described with reference to FIGS. 1–3. Referring initially to FIG. 1, a semiconductor wafer fragment 10 comprises a substrate 12 having a conductively-doped diffusion region 14 therein. Substrate 12 can comprise, for example, monocrystalline silicon lightly doped with background p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Diffusion region 14 can be formed by implanting conductivity-enhancing dopant into the semiconductive material of substrate 12. Diffusion region 14 can be a source/drain region of a transistor device, as known to persons of ordinary skill in the art, and the remainder of such transistor device is represented diagrammatically by a box 16 in FIG. 1.

An electrically conductive pedestal 18 is over diffusion region 14. Pedestal 18 can comprise any suitable conductive material, including, for example, metals, metal compounds, conductively-doped silicon, etc. Pedestal 18 has an upper surface 19 which is an electrical node for electrical connection to a capacitor electrode. In some aspects, pedestal 18 can be omitted.

An electrically insulative material 20 is beside pedestal 18, and electrically isolates pedestal 18 from other electrically conductive materials (not shown) which can be formed over substrate 12. The diagrammatic illustration of FIG. 1 shows insulative material 20 as a single homogeneous material, but it is to be understood that numerous materials can be incorporated into insulative material 20, and further that numerous devices can extend within insulative material 20.

A capacitor electrode 22 is over pedestal 18 and in electrical connection with pedestal 18. In the shown aspect of the invention, electrode 22 is in direct contact (i.e., touches) upper surface 19 of pedestal 18. Electrode 22 can comprise any suitable conductive material, or combination of materials, including, for example, metal, metal compounds, conductively-doped silicon, etc. In particular aspects, the electrode will comprise rugged silicon (such as hemispherical grain silicon) and accordingly will comprise a roughened outer surface rather than the shown smooth surface.

A dielectric material 24 extends over the outer surface of capacitor electrode 22. Dielectric material 24 can comprise any suitable material, or combination of materials, including, for example, high-k materials and/or low-k materials. In particular aspects, capacitor dielectric 24 will comprise one or more of aluminum oxide, hafnium oxide, silicon dioxide and silicon nitride.

Figure 2:
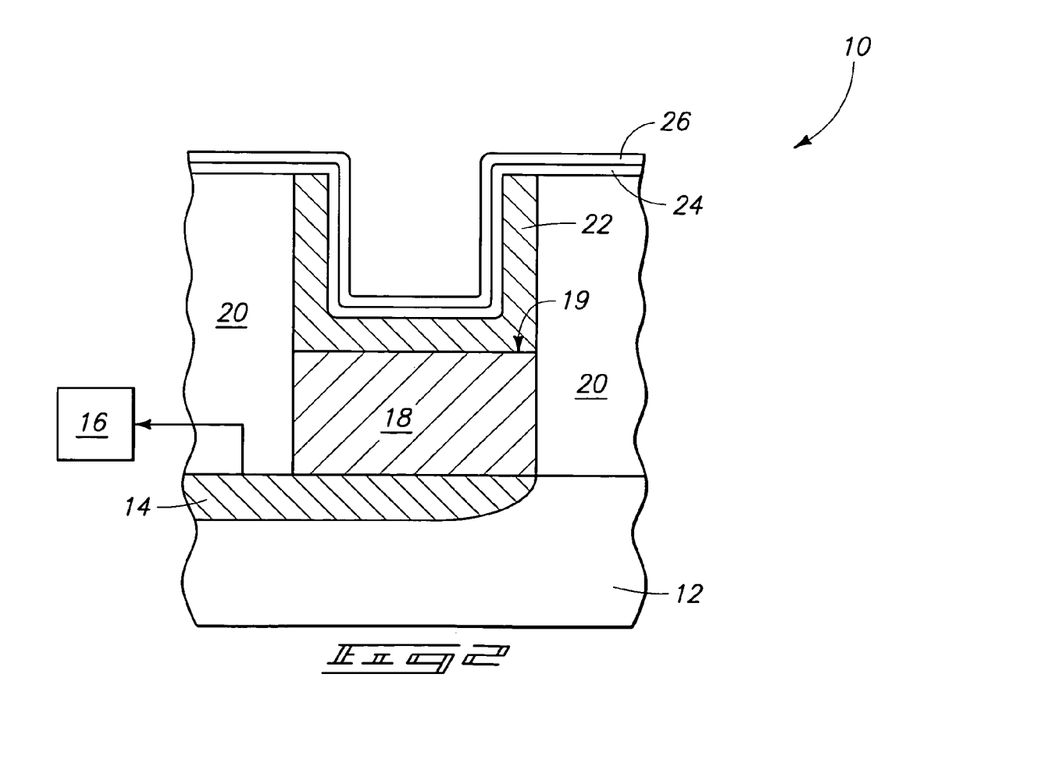
FIG. 2 is a view of the FIG. 1 wafer fragment shown at a processing stage subsequent to that of FIG. 1 in accordance with the exemplary first embodiment aspect.

FIG. 2 shows wafer fragment 10 at a processing stage subsequent to that of FIG. 1. A metal nitride layer 26 is formed over dielectric material 24, and in the shown aspect of the invention is formed in direct contact with dielectric material 24. Metal nitride layer 26 can comprise, consist essentially of, or consist of metal nitride, and in particular aspects will comprise, consist essentially of, or consist of titanium nitride. Metal nitride layer 26 is formed from a non-halogenated metal-containing precursor, preferably in the absence of halogenated metal-containing precursor. The non-halogenated precursor can be a metallo-organic precursor, and in some aspects can comprise metal, carbon, hydrogen and nitrogen. For instance, if metal nitride layer 26 comprises titanium nitride, such can be formed utilizing TDMAT. An exemplary process for forming layer 26 is an ALD process utilizing TDMAT (as the source of titanium) and a nitrogen source (such as ammonia). The ALD can be conducted at a temperature of 125° C. Alternatively, layer 26 can be formed utilizing CVD with TDMAT and a nitrogen source (such as ammonia).

Layer 26 preferably has a thickness of less than or equal to about 20 Å, and in some aspects can be formed to a thickness of from at least about 10 Å to less than or equal to about 20 Å. Layer 26 is shown without cross-hatching because the conductivity of layer 26 can vary depending upon the level of oxidation of the layer. As discussed above, metal nitrides formed from metallo-organic precursor materials (such as, for example, titanium nitride formed from TDMAT) can frequently be relatively easy to oxidize. If layer 26 is sufficiently oxidized, the layer can be relatively electrically insulative, whereas if the layer does not oxidize, or oxidizes to only a low level, the layer will be electrically conductive.

In some aspects, layer 26 can be formed to be substantially fully oxidized, and can thus consist essentially of, or consist of metal, oxygen and nitrogen. In one of such aspects, layer 26 can be initially formed to consist essentially of, or consist of metal nitride, and the layer can then be converted to an oxidized material by exposing layer 26 to an oxidizing ambient. In another of such aspects, metal nitride layer 26 can be formed in the presence of an oxidizing ambient so that the layer is oxidized as deposited.

Figure 3:
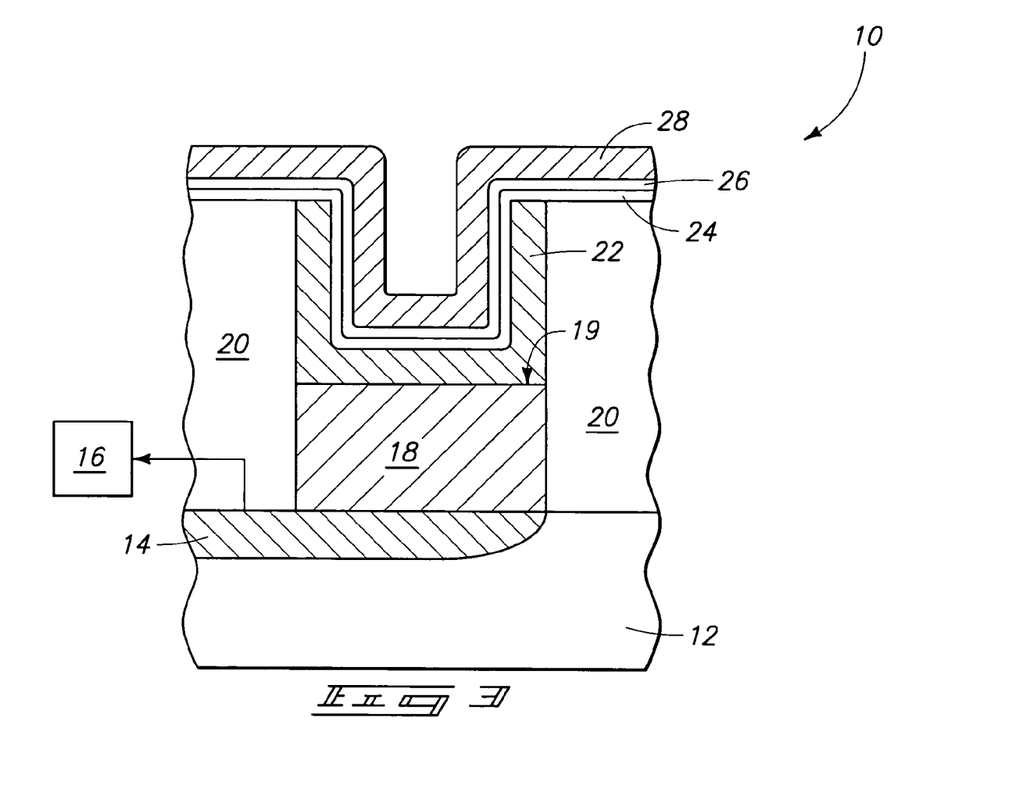
FIG. 3 is a view of the FIG. 1 wafer fragment shown at a processing stage subsequent to that of FIG. 2 in accordance with the exemplary first embodiment aspect.

Referring next to FIG. 3, an electrically conductive metal nitride layer 28 is formed over metal nitride layer 26. Metal nitride layer 28 is formed utilizing a halogenated metal-containing precursor. In particular aspects, layer 28 is formed only from halogenated metal-containing precursor, and accordingly is formed without utilizing non-halogenated metal-containing precursor.

Metal nitride layer 28 is formed over and in direct contact with metal nitride layer 26 in the shown aspect of the invention, and accordingly is spaced from dielectric material 24 by metal nitride layer 26.

Metal nitride layer 28 can comprise the same metal as metal nitride layer 26, and in particular aspects, metal nitride layers 26 and 28 will both consist essentially of, or consist of the same metal nitride. For instance, metal nitride layers 26 and 28 can both comprise, consist essentially of, or consist of titanium nitride.

If layer 28 comprises titanium nitride, the layer can be formed utilizing $TiCl_4$ as a halogenated titanium-containing precursor. The halogenated titanium-containing precursor can be utilized in combination with ammonia to deposit layer 28, with suitable deposition conditions being CVD conditions or ALD conditions. For instance, layer 28 can be formed utilizing ALD conditions with $TiCl_4$ and ammonia at processing temperatures of from about 400° C. to about 600° C. Layer 28 is preferably much thicker than layer 26, in that the resistance of layer 28 to oxidation can allow the conductivity of layer 28 to be better controlled than that of layer 26. Specifically, layer 28 will remain conductive even if exposed to an oxidizing ambient. An exemplary thickness for layer 28 is greater than 100 Å, with typical thicknesses being from about 100 Å to about 150 Å.

Layers 26 and 28 can be referred to as a first metal nitride layer and a second metal nitride layer in the claims that follow. Layer 28 can be incorporated into a second capacitor electrode which is spaced from the first capacitor electrode 22 by dielectric material 24. Accordingly, the first and second capacitor electrodes, together with dielectric material, can form a capacitor construction. Such capacitor construction can be utilized in combination with transistor device 16 as a dynamic random access memory (DRAM) unit cell, and can be formed as part of a DRAM array. The metal nitride layer 26 can be considered part of the second capacitor electrode if the layer has suitable conductivity, or can be considered part of the dielectric material if the metal nitride is sufficiently oxidized to be effectively electrically insulative.

Layers 26 and 28 can be formed in separate reaction chambers from one another (i.e., formed ex situ relative one another), or can be formed in a common reaction chamber (i.e., formed in situ relative one another). In particular aspects, layers 26 and 28 can be formed in a common ALD or CVD reaction chamber, with a seal to the chamber not being broken from the initiation of formation of layer 26 until completion of formation of layer 28. For an exemplary CVD process, layer 26 is formed in the reaction chamber by introducing an appropriate non-halogenated metal-containing precursor into the reaction chamber in combination with a nitrogen-containing precursor, and, after completion of formation of layer 26, a halogenated metal-containing precursor is introduced into the chamber together with an appropriate nitrogen-containing precursor to form layer 28. The non-halogenated precursor utilized to form layer 26 can be purged from the chamber prior to introduction of the halogenated metal-containing precursor. The nitrogen-containing precursor utilized to form layer 28 can be different than that utilized to form layer 26 or can be the same. For instance, if layers 26 and 28 comprise titanium, the non-halogenated precursor can-comprise TDMAT, the halogenated precursor can comprise $TiCl_4$, and the nitrogen-containing precursor can comprise ammonia during both formation of layer 26 and formation of layer 28.

The top capacitor electrode comprising material 28 can, in some aspects, comprise metal nitride material 28 alone, and in other aspects can comprise material 28 together with a plurality of other conductive layers (such as layers comprising metal, metal alloys and/or conductively-doped silicon). If material 28 is utilized with a plurality of other conductive layers, material 28 will typically be in a location relative to the other layers such that the metal nitride layer 28 directly contacts metal nitride layer 26. The direct contact of layers 26 and 28 can allow a common processing chamber to be used for forming the layers 26 and 28, and in some aspects the chamber can remain sealed from initiation of formation of layer 26 until completion of formation of layer 28, as discussed above.

Figure 4:
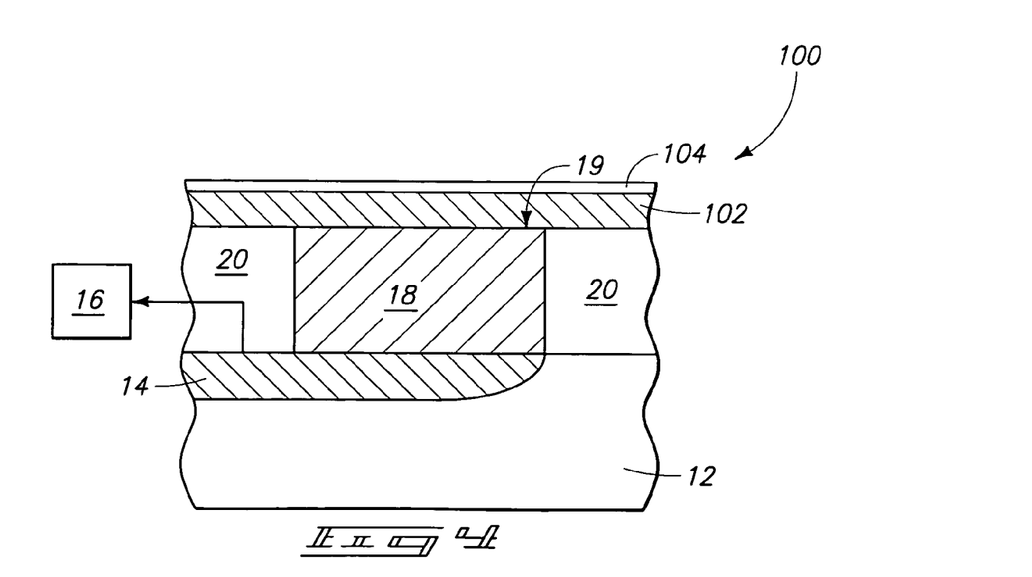
FIG. 4 is a diagrammatic, cross-sectional view of a semiconductor wafer fragment shown at a preliminary processing stage of an exemplary second embodiment aspect of the present invention.

Another aspect of the invention is described with reference to FIGS. 4–5. In referring to FIGS. 4–5, similar numbering will be used as was used above in describing FIGS. 1–3, where appropriate. A semiconductor construction 100 is shown in FIG. 4, and such construction comprises the substrate 12 and diffusion region 14 described previously. The construction also comprises the transistor device 16, insulative material 20, and pedestal 18 described above. Insulative material 20 is shown differently in FIG. 4 than in FIG. 1, in that insulative material 20 of FIG. 4 has an uppermost surface which is substantially planar with the uppermost surface 19 of pedestal 18. Such can be accomplished by for example, chemical-mechanical planarization. It is to be understood that the structure of FIG. 4 is shown to illustrate another potential configuration for methodology of the present invention, and that the configuration of insulative material 20 of FIGS. 1–3 could also be utilized in the methodology of FIGS. 4 and 5, or the configuration of FIG. 4 could be utilized in the aspect of FIGS. 1–3, as will be recognized by a person of ordinary skill in the art.

An electrically-conductive metal nitride layer 102 is formed over upper surface 19 of pedestal 18, and in the shown aspect of the invention is in direct contact with the upper surface 19. Metal nitride layer 102 is formed using a halogenated metal-containing precursor, and can be formed utilizing identical processing as was described above with reference to metal nitride 28 of FIG. 3.

A metal nitride layer 104 is formed over metal nitride layer 102. Metal nitride layer 104 is formed utilizing non-halogenated metal-containing precursor, and preferably is formed without halogenated metal-containing precursor being present. Layer 104 can be formed utilizing identical processing as was described above for formation of layer 26 (FIG. 2).

Figure 5:
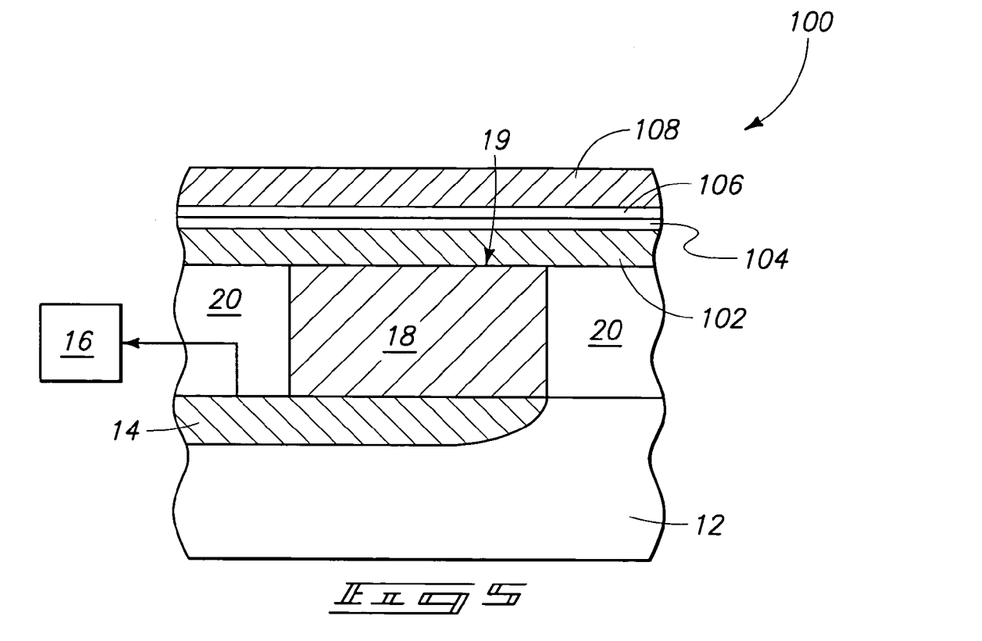
FIG. 5 is a view of the FIG. 4 wafer fragment shown at a processing stage subsequent to that of FIG. 4 in accordance with the exemplary second embodiment aspect of the present invention.

Referring to FIG. 5, a dielectric material 106 is formed over dielectric material 104, and a capacitor electrode 108 is formed over dielectric material 106. Dielectric material 106 and capacitor electrode 108 can comprise identical compositions as described above for dielectric material 24 and capacitor electrode 22, respectively (FIGS. 1–3).

The construction of FIG. 5 comprises a capacitor having a first electrode which incorporates metal nitride material 102, a second electrode 108, and a dielectric material 106 between the first and second capacitor electrodes. The metal nitride material 104 can be considered part of the first capacitor electrode if the material 104 is suitably conductive, and otherwise can be considered part of the capacitor dielectric. It is preferred that material 104 be very thin in applications in which the material 104 is part of a bottom electrode, due to difficulties in controlling the conductive properties of the material 104 that has been exposed to conditions utilized for formation of dielectric material on the material 104. Material 104 will typically be formed to a thickness of less than or equal to about 10 Å. Material 102 can be formed to comparable thicknesses to those discussed above with reference to metal nitride 28, and accordingly can have a thickness greater than 100 Å, and typically will have a thickness of from about 100 Å to about 150 Å.

The bottom capacitor electrode comprising material 102 can, in some aspects, comprise metal nitride material 102 alone, and in other aspects can comprise material 102 together with a plurality of other conductive layers (such as layers comprising metal, metal alloys and/or conductively-doped silicon). If material 102 is utilized with a plurality of other conductive layers, the material 102 will typically be an uppermost of the layers so that the metal nitride layers 102 and 104 will be in direct contact with one another. The direct contact of layers 102 and 104 can allow a common processing chamber to be used for forming the layers 102 and 104, and in some aspects the chamber can remain sealed from initiation of formation of layer 102 until completion of formation of layer 104.

Metal nitride layers 102 and 104 can be referred to as a first metal nitride layer and a second metal nitride layer, respectively. Utilization of the terms "first metal nitride layer" and "second metal nitride layer" is in a sense reversed in describing the embodiment of FIG. 5 relative to the description of the embodiment of FIG. 3. Specifically, the metal nitride layer formed utilizing the halogenated precursor of FIG. 5 (layer 102) is referred to as a first metal nitride layer, and the layer formed utilizing the non-halogenated metal-containing precursor (layer 104) is referred to as a second metal nitride, whereas in the embodiment of FIG. 3 the layer formed utilizing the non-halogenated precursor (layer 26) is referred to as a first metal nitride and the layer formed utilizing the halogenated metal-containing precursor (layer 28) is referred to as a second metal nitride.

Commonality between the embodiment of FIG. 5 and that of FIG. 3 is that a metal nitride is formed proximate a dielectric material (the metal nitride of FIG. 3 comprising layers 26 and 28, and that of FIG. 5 comprising layers 102 and 104), with a portion of the metal nitride nearest the dielectric material being formed from a non-halogenated metal-containing precursor (the portion 26 of FIG. 3 and the portion 104 of FIG. 5), while the portion furthest from the dielectric material is formed from a halogenated metal-containing precursor (the portion 28 of FIG. 3 and the portion 102 of FIG. 5).

The aspects of FIGS. 1–3 and 4–5 can be combined. Such is described with reference to a semiconductor wafer fragment 200 of FIG. 6. Identical numbering is used in FIG. 6 as was utilized above in FIGS. 1–5, were appropriate.

Figure 6:
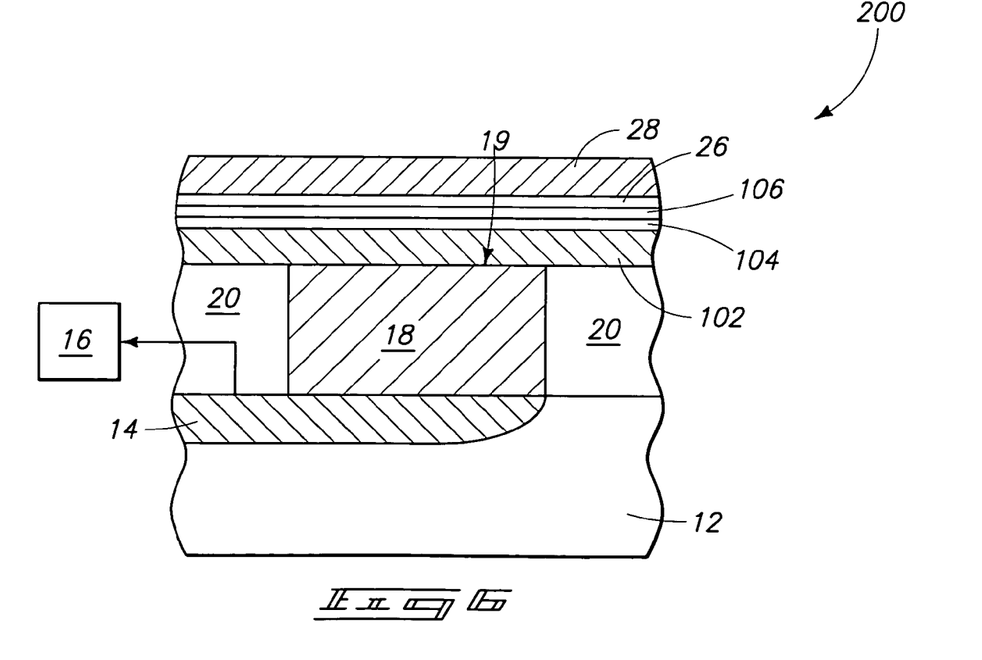
FIG. 6 is a view of the FIG. 4 wafer fragment shown at a processing stage subsequent to that of FIG. 4 in accordance with an exemplary third embodiment aspect of the present invention.

Construction 200 comprises the substrate 12, diffusion region 14, transistor structure 16, insulative material 20, and pedestal 18 described previously. Construction 200 further comprises the metal nitride layers 102 and 104 of FIG. 5, and the dielectric material 106. Additionally, construction 200 comprises the metal nitride layers 26 and 28 of FIG. 3. Accordingly, construction 200 comprises a capacitor device in which a first electrode comprises metal nitride layer 102 and a second electrode comprises metal nitride layer 28, with layers 102 and 28 both being formed utilizing halogenated metal-containing precursor. The layers 102 and 28 are separated from dielectric material 106 by the metal nitride layers 104 and 26 formed from non-halogenated precursor.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in-accordance with the doctrine of equivalents.

The invention claimed is:

1. A method of forming a metal nitride proximate a dielectric material comprising;
    forming a portion of the metal nitride nearest the dielectric material from a non-halogenated metal-containing precursor without utilizing halogenated metal-containing precursor; and
    forming another portion of the metal nitride from a halogenated metal-containing precursor.

2. The method of claim 1 wherein the portions of the metal nitride formed from non-halogenated metal-containing precursor and halogenated metal-containing precursor are formed in situ relative to one another.

3. The method of claim 1 wherein the portions of the metal nitride formed from non-halogenated metal-containing precursor and halogenated metal-containing precursor are formed ex situ relative to one another.

4. The method of claim 1 wherein said other portion of the metal nitride is a portion of the metal nitride furthest from the dielectric material.

5. The method of claim 1 wherein the metal nitride is in direct contact with the dielectric material.

6. The method of claim 1 wherein the dielectric material is between two of the metal nitrides, and wherein the two metal nitrides and the dielectric material are together comprised by a capacitor structure.

7. The method of claim 1 wherein the dielectric material is a high-k dielectric.

8. The method of claim 1 wherein the metal nitride consists essentially of titanium nitride.

9. The method of claim 1 wherein the metal nitride consists of titanium nitride.

10. The method of claim 9 wherein the non-halogenated precursor comprises carbon, nitrogen and hydrogen.

11. The method of claim 10 wherein the non-halogenated precursor is TDMAT.

12. The method of claim 1 wherein the halogenated precursor utilized to form said other portion of the metal nitride is $TiCl_4$.

13. The method of claim 1 wherein said other portion of the metal nitride is formed without utilizing non-halogenated metal-containing precursor.

14. A method of forming a semiconductor construction, comprising:
    forming dielectric material over a semiconductor substrate;
    forming a first metal nitride layer comprising a first metal nitride, the first metal nitride layer being formed utilizing a non-halogenated metal-containing precursor and without utilizing halogenated metal-containing precursor, the first metal nitride layer being over and in direct contact with the dielectric material; and
    forming a second metal nitride layer comprising a second metal nitride, the second metal nitride layer being formed utilizing a halogenated metal-containing precursor, the second metal nitride layer being over and in direct contact with the first metal nitride layer, the second metal nitride layer being spaced from the dielectric material by the first metal nitride layer.

15. The method of claim 14 wherein the first and second metal nitride layers are formed in situ relative to one another.

16. The method of claim 14 wherein the first and second metal nitride layers are formed ex situ relative to one another.

17. The method of claim 14 wherein the first and second metal nitride layers consist essentially of the first and second metal nitrides, respectively.

18. The method of claim 14 wherein the first and second metal nitride layers consist of the first and second metal nitrides, respectively.

19. The method of claim 14 wherein the first and second metal nitride layers contain the same metal as one another.

20. The method of claim 14 wherein the first and second metal nitride layers both consist essentially of titanium nitride.

21. The method of claim 20 wherein the non-halogenated precursor utilized to form the first metal nitride layer comprises carbon, nitrogen and hydrogen.

22. The method of claim 21 wherein the non-halogenated precursor utilized to form the first metal nitride layer is TDMAT.

23. The method of claim 22 wherein the halogenated precursor utilized to form the second metal nitride layer is $TiCl_4$.

24. The method of claim 14 wherein the first and second metal nitride layers both consist of titanium nitride.

25. The method of claim 14 wherein the second metal nitride layer is formed without utilizing non-halogenated metal-containing precursor.

26. The method of claim 14 wherein the dielectric material is a high-k dielectric.

27. The method of claim 14 wherein the dielectric material comprises one or both of aluminum oxide and hafnium oxide.

28. A method of forming a semiconductor construction, comprising:
    forming a first metal nitride layer over a semiconductor substrate, the first metal nitride layer comprising a first metal nitride, the first metal nitride layer being formed utilizing a halogenated metal-containing precursor;
    forming a second metal nitride layer comprising a second metal nitride, the second metal nitride layer being formed utilizing a non-halogenated metal-containing precursor and without utilizing halogenated metal-containing precursor, the second metal nitride layer being over and in direct contact with the first metal nitride layer; and
    forming dielectric material over and in direct contact with the second metal nitride layer, the dielectric material being spaced from the first metal nitride layer by the second metal nitride layer.

29. The method of claim 28 wherein the first and second metal nitride layers are formed in situ relative to one another.

30. The method of claim 28 wherein the first and second metal nitride layers are formed ex situ relative to one another.

31. The method of claim 28 wherein the first and second metal nitride layers consist essentially of the first and second metal nitrides, respectively.

32. The method of claim 28 wherein the first and second metal nitride layers consist of the first and second metal nitrides, respectively.

33. The method of claim 28 wherein the first and second metal nitride layers contain the same metal as one another.

34. The method of claim 28 wherein the first and second metal nitride layers both consist essentially of titanium nitride.

35. The method of claim 34 wherein the non-halogenated precursor utilized to form the second metal nitride layer comprises carbon, nitrogen and hydrogen.

36. The method of claim 35 wherein the non-halogenated precursor utilized to form the second metal nitride layer is TDMAT.

37. The method of claim 36 wherein the halogenated precursor utilized to form the first metal nitride layer is $TiCl_4$.

38. The method of claim 28 wherein the first and second metal nitride layers both consist of titanium nitride.

39. The method of claim 28 wherein the first metal nitride layer is formed without utilizing non-halogenated metal-containing precursor.

40. The method of claim 28 wherein the dielectric material is a high-k dielectric.

41. A method of forming a capacitor construction, comprising:
    providing a semiconductor substrate;
    forming a first capacitor electrode over the semiconductor substrate;
    forming dielectric material over the first capacitor electrode;
    forming a first metal nitride layer comprising a first metal nitride, the first metal nitride layer being formed utilizing a non-halbgenated metal-containing precursor and without utilizing halogenated metal-containing precursor, the first metal nitride layer being over and in direct contact with the dielectric material;
    forming a second metal nitride layer comprising a second metal nitride, the second metal nitride layer being formed utilizing a halogenated metal-containing precursor, the second metal nitride layer being over and in direct contact with the first metal nitride layer, the second metal nitride layer being spaced from the dielectric material by the first metal nitride layer; and
    wherein the second metal nitride layer is comprised by a second capacitor electrode which is part of a capacitor comprising the first capacitor electrode and the dielectric material.

42. The method of claim 41 wherein the first and second metal nitride layers are formed by a deposition process in a reaction chamber, and wherein a seal to the reaction chamber is not broken from the initiation of formation of the first metal nitride layer until after completion of formation of the second metal nitride layer.

43. The method of claim 42 wherein the deposition process is an ALD process or a CVD process.

44. The method of claim 41 wherein the first and second metal nitride layers consist essentially of the first and second metal nitrides, respectively.

45. The method of claim 41 wherein the first and second metal nitride layers consist of the first and second metal nitrides, respectively.

46. The method of claim 41 wherein the first metal nitride layer is formed to a thickness of less than or equal to about 20 Å.

47. The method of claim 41 wherein the second metal nitride layer is formed to a thickness of at least about 100 Å.

48. The method of claim 41 wherein the second metal nitride layer is formed to a thickness of from about 100 Å to about 150 Å.

49. The method of claim 41 wherein the first metal nitride layer is formed to a thickness of less than or equal to about 20 Å, and wherein the second metal nitride layer is formed to a thickness of at least about 100 Å.

50. The method of claim 41 wherein the first and second metal nitride layers both consist essentially of titanium nitride.

51. The method of claim 50 wherein the non-halogenated precursor utilized to form the first metal nitride layer comprises carbon, nitrogen and hydrogen.

52. The method of claim 51 wherein the non-halogenated precursor utilized to form the first metal nitride layer is TDMAT.

53. The method of claim 52 wherein the halogenated precursor utilized to form the second metal nitride layer is $TiCl_4$.

54. The method of claim 41 wherein the first and second metal nitride layers both consist of titanium nitride.

55. The method of claim 41 wherein the second metal nitride layer is formed without utilizing non-halogenated metal-containing precursor.

56. The method of claim 41 wherein the dielectric material is a high-k dielectric.

57. The method of claim 41 wherein the dielectric material comprises one or both of aluminum oxide and hafnium oxide.

58. A method of forming a capacitor construction, comprising:
    forming a first metal nitride layer over a semiconductor substrate, the first metal nitride layer comprising a first metal nitride, the first metal nitride layer being formed utilizing a halogenated metal-containing precursor, the first metal nitride layer being incorporated within a first capacitor electrode;
    forming a second metal nitride layer comprising a second metal nitride, the second metal nitride layer being formed utilizing a non-halogenated metal-containing precursor and without utilizing halogenated metal-containing precursor, the second metal nitride layer being over and in direct contact with the first metal nitride layer;
    forming dielectric material over and in direct contact with the second metal nitride layer, the dielectric material being spaced from the first metal nitride layer by the second metal nitride layer; and
    forming a second capacitor electrode over the dielectric material, the first capacitor electrode, dielectric material and second capacitor electrode being incorporated within a capacitor structure.

59. The method of claim 58 wherein the first and second metal nitride layers contain the same metal as one another.

60. The method of claim 58 wherein the first and second metal nitride layers both consist essentially of titanium nitride.

61. The method of claim 60 wherein the non-halogenated precursor utilized to form the second metal nitride layer comprises carbon, nitrogen and hydrogen.

62. The method of claim 61 wherein the non-halogenated precursor utilized to form the second metal nitride layer is TDMAT.

63. The method of claim 58 wherein the halogenated precursor utilized to form the first metal nitride layer is $TiCl_4$.

64. The method of claim 58 wherein the first and second metal nitride layers both consist of titanium nitride.

65. The method of claim 58 wherein the first metal nitride layer is formed without utilizing non-halogenated metal-containing precursor.

66. The method of claim 58 wherein the dielectric material is a high-k dielectric.

67. The method of claim 58 wherein the first and second metal nitride layers are formed by a deposition process in a reaction chamber, and wherein a seal to the reaction chamber is not broken from the initiation of formation of the first metal nitride layer until after completion of formation of the second metal nitride layer.

68. The method of claim 67 wherein the deposition process is an ALD process or a CVD process.

69. The method of claim 58 wherein the first metal nitride layer is formed to a thickness of at least about 100 Å.

70. The method of claim 58 wherein the first metal nitride layer is formed to a thickness of from about 100 Å to about 150 Å.

71. The method of claim 58 wherein the second metal nitride layer is formed to a thickness of less than or equal to about 10 Å.

72. The method of claim 58 wherein the first metal nitride layer is formed to a thickness of at least about 100 Å, and wherein the second metal nitride layer is formed to a thickness of less than or equal to about 10 Å.

73. The method of claim 58 wherein the non-halogenated metal-containing precursor utilized to form the second metal nitride layer is a first non-halogenated metal-containing precursor, wherein the halogenated metal-containing precursor utilized to form the first metal nitride layer is a first halogenated metal-containing precursor, and the method further comprising:
    forming a third metal nitride layer comprising a third metal nitride, the third metal nitride layer being formed utilizing a second non-halogenated metal-containing precursor and without utilizing halogenated metal-containing precursor, the third metal nitride layer being over and in direct contact with the dielectric material; and
    forming a fourth metal nitride layer-comprising a-fourth metal nitride, the fourth metal nitride layer being formed utilizing a second halogenated metal-containing precursor, the fourth metal nitride layer being over and in direct contact with the third metal nitride layer, the fourth metal nitride layer being spaced from the dielectric material by the third metal nitride layer; the fourth metal nitride layer being at least part of the second capacitor electrode.

74. The method of claim 73 wherein the first, second, third and fourth metal nitride layers contain the same metal as one another.

75. The method of claim 73 wherein the first, second, third and fourth metal nitride layers consist essentially of titanium nitride.

76. The method of claim 73 wherein the first, second, third and fourth metal nitride layers consist of titanium nitride.

77. The method of claim 73 wherein the first and second non-halogenated metal-containing precursors are the same as one another.

78. The method of claim 73 wherein the first and second halogenated metal-containing precursors are the same as one another.

79. The method of claim 73 wherein the first and fourth metal nitride layers are formed without utilizing non-halogenated metal-containing precursor.

80. The method of claim 73 wherein the dielectric material is a high-k dielectric.

81. The method of claim 73 wherein the third metal nitride layer is formed to a thickness of less than or equal to about 20 Å.

82. The method of claim 73 wherein the fourth metal nitride layer is formed to a thickness of at least about 100 Å.

83. The method of claim 73 wherein the third metal nitride layer is formed to a thickness of less than or equal to about 20 Å, and wherein the fourth metal nitride layer is formed to a thickness of at least about 100 Å.

84. The method of claim 73 wherein the first metal nitride layer is formed to a thickness of at least about 100 Å, wherein the second metal nitride layer is formed to a thickness of less than or equal to about 10 Å, wherein the third metal nitride layer is formed to a thickness of less than or equal to about 20 Å, and wherein the fourth metal nitride layer is formed to a thickness of at least about 100 Å.

85. The method of claim 84 wherein the third metal nitride layer is formed to thickness of from greater than 10 Å to less than or equal to about 20 Å.

86. The method of claim 84 wherein the first, second, third and fourth metal nitride layers consist essentially of titanium nitride.

87. The method of claim 84 wherein the first, second, third and fourth metal nitride layers consist of titanium nitride.

* * * * *

UNITED STATES PATENT AND TRADEMARK OFFICE
CERTIFICATE OF CORRECTION

PATENT NO. : 7,148,118 B2
APPLICATION NO. : 10/887962
DATED : December 12, 2006
INVENTOR(S) : Lingyi A. Zheng It is certified that error appears in the above-identified patent and that said Letters Patent is hereby corrected as shown below:

Col. 2, line 54 –
  Replace "can adversely-affect the properties of the dielectric"
  With --can adversely affect the properties of the dielectric--

Col. 5, line 55 –
  Replace "halogenated precursor can-comprise TDMAT, the"
  With --halogenated precursor can comprise TDMAT, the--

Col. 7, line 66 –
  Replace "claims appropriately interpreted in-accordance with the"
  With --claims appropriate interpreted in accordance with the--

Col. 10, line 20 –
  Replace "a non-halbgenated metal-containing precursor"
  With --a non-halogenated metal-containing precursor--

Col. 12, line 28 –
  Replace "forming a fourth metal nitride layer-comprising a-fourth"
  With --forming a fourth metal nitride layer comprising a fourth--

Signed and Sealed this

Twenty-first Day of August, 2007

JON W. DUDAS
*Director of the United States Patent and Trademark Office*